(12) United States Patent
Viljanen et al.

(10) Patent No.: US 11,380,600 B2
(45) Date of Patent: Jul. 5, 2022

(54) SEMICONDUCTOR APPARATUS

(71) Applicant: Teknologian tutkimuskeskus VTT Oy, Espoo (FI)

(72) Inventors: Heikki Viljanen, VTT (FI); Pekka Rantakari, VTT (FI); Tauno Vähä-Heikkilä, VTT (FI); Esa Tuovinen, VTT (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 5 days.

(21) Appl. No.: 16/617,307

(22) PCT Filed: May 28, 2018

(86) PCT No.: PCT/FI2018/050404
§ 371 (c)(1),
(2) Date: Nov. 26, 2019

(87) PCT Pub. No.: WO2018/220275
PCT Pub. Date: Dec. 6, 2018

(65) Prior Publication Data
US 2020/0152537 A1    May 14, 2020

(30) Foreign Application Priority Data
May 29, 2017   (FI) ...................... 20175480

(51) Int. Cl.
*H01L 23/29* (2006.01)
*H01L 23/31* (2006.01)
(Continued)

(52) U.S. Cl.
CPC ........ *H01L 23/3171* (2013.01); *H01L 23/291* (2013.01); *H01L 28/10* (2013.01);
(Continued)

(58) Field of Classification Search
None
See application file for complete search history.

(56) References Cited

U.S. PATENT DOCUMENTS 7,868,419 B1    1/2011   Kerr et al.
9,385,079 B2 *  7/2016   Chang ................. H01L 23/5223
(Continued)

FOREIGN PATENT DOCUMENTS

CN    104241410 A    12/2014
JP    H01309334 A    12/1989
(Continued)

OTHER PUBLICATIONS

"Engineering the fixed charge of aluminum oxide for field assisted passivation in heterojunction solar cells" Scott Chow, NNIN REU (Year: 2015).*
(Continued)

*Primary Examiner* — Bradley Smith
(74) *Attorney, Agent, or Firm* — Ziegler IP Law Group, LLC

(57) ABSTRACT

A semiconductor apparatus having a silicon substrate layer at least portion of which is doped with dopants of a conductivity type; and at least one insulator layer formed above the silicon substrate layer, wherein the at least one insulator layer and the dopants of the silicon substrate layer have opposite electric charges.

13 Claims, 3 Drawing Sheets

(51) Int. Cl.
  *H01L 49/02* (2006.01)
  *H01L 21/02* (2006.01)

(52) U.S. Cl.
  CPC .............. *H01L 28/20* (2013.01); *H01L 28/60* (2013.01); *H01L 21/0228* (2013.01); *H01L 21/02178* (2013.01); *H01L 21/02274* (2013.01)

(56) References Cited

U.S. PATENT DOCUMENTS

| | | | |
|---|---|---|---|
| 2002/0093075 | A1 | 7/2002 | Gates et al. |
| 2008/0169527 | A1 | 7/2008 | Van Noort |
| 2008/0173974 | A1* | 7/2008 | Van Noort .......... H01L 27/0641 257/528 |
| 2008/0246114 | A1* | 10/2008 | Abrokwah ............ H01L 27/016 257/531 |
| 2009/0236689 | A1 | 9/2009 | Daly et al. |
| 2014/0252535 | A1* | 9/2014 | Hurwitz ................ H01L 21/762 257/506 |
| 2015/0214150 | A1 | 7/2015 | Chang et al. |
| 2015/0295101 | A1 | 10/2015 | Potter |
| 2016/0071927 | A1 | 3/2016 | Hurwitz |

FOREIGN PATENT DOCUMENTS

| | | |
|---|---|---|
| JP | 2011040621 A | 2/2011 |
| JP | 2013503479 A | 1/2013 |
| JP | 2014036213 A | 2/2014 |

OTHER PUBLICATIONS

Norling, M. et al. "Comparison of high-resistivity silicon surface passivation methods" In: European Microwave Integrated Circuit Conference, 2007. IEEE, Oct. 8, 2007, retrieved Sep. 20, 2017, DOI: 10.1109/EMICC.2007.4412687, 4 pages.

Finnish Patent and Registration Office, Search Report, Application No. 20175480, dated Sep. 26, 2017, 3 pages.

International Search Report and Written Opinion, Application No. PCT/FI2018/050404, dated Sep. 10, 2018, 13 pages.

Japan Patent Office, Notice of Allowance, Application No. 2019-565170, dated Oct. 20, 2021, 3 pages.

Korean Intellectual Property Office, Notice of Non-Final Rejection, Application No. 10-2019-7038311, dated Feb. 28, 2022, 31 pages, English Translation, 5 pages.

* cited by examiner

SEMICONDUCTOR APPARATUS

TECHNICAL FIELD

The present application generally relates to a semiconductor apparatus. In particular, but not exclusively, the present application relates to surface passivated silicon substrates. In particular, but not exclusively, the present application relates to radio frequency (RF) performance of integrated passive devices (IPD).

BACKGROUND

This section illustrates useful background information without admission of any technique described herein being representative of the state of the art.

Passive components are used basically in all electronic modules and systems, such as in radio frequency (RF) applications. One trend is to integrate as many passives as possible to semiconductor integrated circuit (IC) chip and other trend is to use as much external discrete passive components in printed circuit board (PCB) or other technology modules. Practical realizations are something between. IC technologies allow high integration density but on the other hand, surface area is rather expensive and RF performance of large area passives is rather low due to low resistivity substrates. Especially inductors have low performance and they are expensive to realize in IC technologies because of their large size. On the other hand, discrete passive components have high performance but they are typically large in size and require assembly to modules.

Integrated passive devices (IPD) technology is an alternative way for realizing high quality factor (Q) passives in low loss substrates. Combining most of passive components to IPD and then integrating IPD based module to a system enables high performance, high integration density and lower assembly cost. Especially RF front-end modules and components requiring high-Q inductors are beneficial to integrate to IPD such as baluns, couplers, filters, LC resonators and matching circuits Known solutions, especially integrated passive device (IPD) technology for RF applications utilizing high resistivity silicon substrates have shown relatively high RF losses.

It is the aim of the aspects of the disclosed embodiments to provide a method and apparatus that mitigates for example the above problem of the state of the art.

SUMMARY

Various aspects of examples of the disclosed embodiments are set out in the claims.

According to a first example aspect of the present disclosure, there is provided a semiconductor apparatus comprising:

a silicon substrate layer at least portion of which is doped with dopants of a conductivity type; and a first insulator layer formed above the silicon substrate layer;

wherein the first insulator layer and the dopants of the silicon substrate layer have opposite electric charges.

In an embodiment, the semiconductor apparatus comprises an integrated passive device (IPD).

In an embodiment, the semiconductor apparatus further comprises:

a first metal layer, wherein the first insulator layer comprises a passivation layer arranged between the silicon substrate layer and the first metal layer.

In an embodiment, the semiconductor apparatus further comprises:

a second insulator layer and a second metal layer, wherein the second insulator layer is arranged between the first metal layer and the second metal layer, and the second metal layer is arranged above the first metal layer.

In an embodiment, the semiconductor apparatus further comprises:

a third insulator layer and a third metal layer, wherein the third insulator layer is arranged between the second metal layer and the third metal layer, and the third metal layer is arranged above the second metal layer, wherein at least a portion of the third insulator layer is arranged between the second metal layer and the third metal layer, and the third metal layer is arranged above the second metal layer.

In an embodiment, the semiconductor apparatus further comprises:

at least one barrier layer extending on a surface of at least one metal layer.

In an embodiment, at least one insulator layer comprises an Atomic Layer Deposition (ALD) grown aluminum oxide layer or a plasma enhanced chemical vapor deposition (PECVD) layer.

In an embodiment, a first insulator layer comprises a negative static charge Atomic Layer Deposition (ALD) grown aluminum oxide layer arranged above the silicon substrate layer, wherein the dopants of the silicon substrate layer are of p-type.

In an embodiment, a static charge of the at least one insulator layer is configured to generate a depletion region at an interface between the at least one insulator layer and the silicon substrate layer.

In an embodiment, a static charge of the at least one insulator layer is configured to generate an accumulation region at an interface between the at least one insulator layer and the silicon substrate layer.

In an embodiment, the semiconductor apparatus further comprises:

a fourth insulator layer arranged above the third insulator layer, configured to cover at least partially elements of the third metal layer and to extend horizontally between the elements of the third metal layer.

In an embodiment, the semiconductor apparatus further comprises:

at least one conductive pad connected to the at least one metal layer element through the fourth insulator layer, configured to provide external connection to the semiconductor apparatus.

According to a second example aspect of the present disclosure, there is provided a method for manufacturing a semiconductor apparatus, comprising:

providing a silicon substrate comprising dopants of a first conductivity type;

depositing a first insulator layer on the silicon substrate, wherein a static charge of the first insulator layer is of a second conductivity type, opposite to the first conductivity type; and forming at least one metal layer above the first insulator layer.

In an embodiment, the method further comprises depositing a barrier layer in connection with the at least one metal layer.

In an embodiment, the method further comprises:

forming at least two metal layers above the first insulator layer; and depositing further insulator layers to provide integrated passive device (IPD) elements, wherein at least a portion of at least one insulator layer is arranged between the at least two metal layers.

Different non-binding example aspects and embodiments of the present disclosure have been illustrated in the foregoing. The embodiments in the foregoing are used merely to explain selected aspects or steps that may be utilized in implementations of the present disclosure. Some embodiments may be presented only with reference to certain example aspects of the present disclosure. It should be appreciated that corresponding embodiments may apply to other example aspects as well.

BRIEF DESCRIPTION OF THE DRAWINGS

For a more complete understanding of example embodiments of the present disclosure, reference is now made to the following descriptions taken in connection with the accompanying drawings in which.

DETAILED DESCRIPTION OF THE DRAWINGS

In embodiments, it is disclosed passive components and circuits realized using inductors and capacitors. The integrated passive device (IPD) technology can also be used as an integration platform for multi-chip modules technology with hybrid integrated active circuits, for example.

The integrated passive device (IPD) technology can be manufactured to any substrate that is suitable for thin film processing in clean rooms. Fused silica, quartz or high resistivity silicon are typically used for RF applications due to their good RF properties.

The integrated passive device (IPD) layers can also be post processed to active device wafers such as CMOS, SiGe or GaAs in order to have high Q passives and re-distribution layers (RDL).

In an embodiment, different integrated passive device (IPD) processes can be optimized for different purposes.

The present disclosure and its potential advantages are understood by referring to FIGS. 1 through 5 of the drawings. In this document, like reference signs denote like parts or steps.

Figure 1:
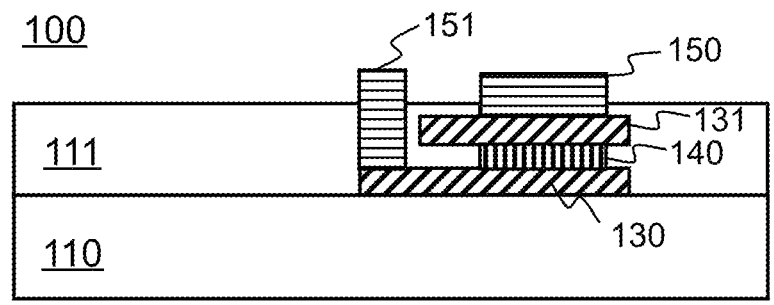
FIG. 1 illustrates a an integrated passive device (IPD) of a semiconductor apparatus.

FIG. 1 illustrates an integrated passive device (IPD) of a semiconductor apparatus 100.

A die (not shown) may be coupled on top of the semiconductor apparatus 100. Furthermore, a circuit board (not shown) may be coupled on top or below of the semiconductor apparatus 100. A solder ball may be utilized for coupling.

The semiconductor apparatus 100 includes a substrate 110, an integrated passive device (IPD) 130-140, a dielectric layer 111, and at least one pad or connecting layer 150-151.

The substrate 110 may comprise a glass or a silicon substrate in some implementations. The integrated passive device (IPD) 130-140 and the dielectric layer 111 are illustrated on a first surface (e.g., top surface) of the substrate 110. In some implementations, the integrated passive device (IPD) 130-140 and the dielectric layer 111 are arranged on a second surface (e.g., bottom surface) of the substrate 110, or on both surfaces.

The integrated passive device (IPD) 130-140 may be at least one of a capacitor, inductor and resistor. It should be noted that FIG. 1 illustrates conceptual representations of the integrated passive device (IPD) 130-140. Specific illustrations and examples of the integrated passive device (IPD) 130-140 are further illustrated and described.

Integrated passive device (IPD) process may comprise basic building blocks like high quality factor (Q) inductors, capacitors and transmission lines. High-Q components and circuits that are suitable to be realized with integrated passive device (IPD) may comprise, for example, capacitors, inductors, baluns, filters, matching networks, antennas, antenna arrays, and feed networks.

Integrated passive device (IPD) process can be used as an integration platform for radio frequency (RF) front-end systems, wherein all passive elements are arranged on the integrated passive device (IPD) substrate and active elements stacked in view of the integrated passive device (IPD) substrate.

Pads 150-151 may comprise at least one metal layer for electrically coupling to the integrated passive device (IPD) 130-140. The metal layer pads 150-151 of the semiconductor device 100 may be coupled to the integrated passive device (IPD) terminals 130-131.

Within the substrate 110 and/or the dielectric layer 111 at least a part of the integrated passive device (IPD) 130-140 may be contained. The integrated passive device (IPD) 130-140 comprises a first IPD metal layer 130, a first IPD dielectric layer 140, and a second IPD metal layer 131. The first IPD metal layer 130 is located on a first surface of the substrate 110. The first IPD dielectric layer 140 is located on a portion of the first IPD metal layer 130. The second IPD metal layer 131 is located on at least the first IPD dielectric layer 140.

As further shown in FIG. 1, the first IPD dielectric layer 140 is located between the first IPD metal layer 130 and the second IPD metal layer 131. In some implementations, the area of the second IPD metal layer 131 overlaps with the area of the first IPD dielectric layer 140. In some implementations, the first IPD dielectric layer 140 is part of the dielectric layer 111.

The integrated passive device (IPD) 130-140 may comprise a capacitor (e.g., decoupling capacitor), resistor or inductor in some implementations. The integrated passive device (IPD) 130-140 may be arranged on a first surface (e.g., top surface) or a second surface of the semiconductor device 100.

The semiconductor device 100 may comprise a plurality of integrated passive devices (IPD) 130-140.

Figure 2:
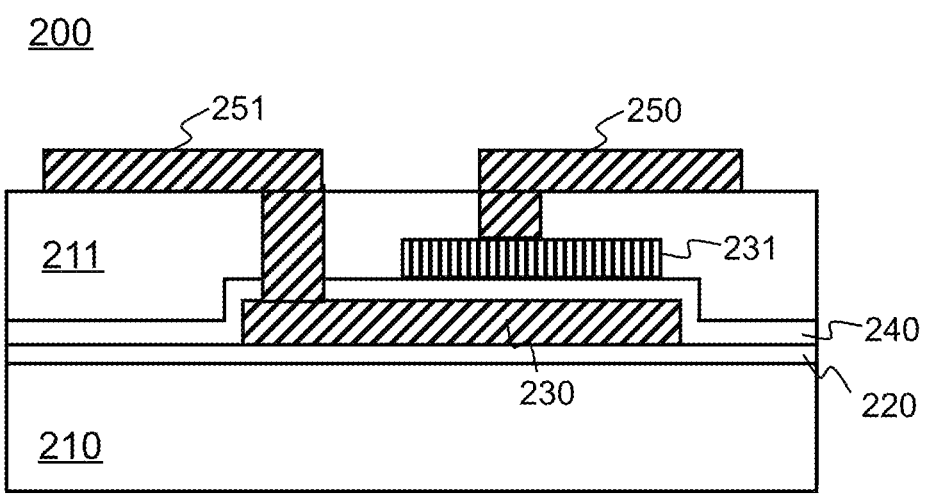
FIG. 2 illustrates a semiconductor apparatus according to an embodiment of the present disclosure.

FIG. 2 illustrates a semiconductor apparatus 200 according to an embodiment of the present disclosure. The semiconductor apparatus 200 may comprise a multi metal layer integrated passive device (IPD) apparatus, for example.

The semiconductor apparatus 200 may comprise a multi-purpose technology being suitable for a plurality of RF applications and frequencies from Very High Frequency (VHF) to millimetre waves. The semiconductor apparatus 200 may further comprise thin film resistors, metal inductors, and metal-insulator-metal (MIM) capacitors between different metal layers.

A semiconductor apparatus 200 comprises a silicon substrate layer 210 at least portion of which is doped with dopants of a conductivity type, and at least one insulator layer 211, 220, 240 formed above the silicon substrate layer 210, wherein at least one insulator layer 211, 220, 240 and the dopants of the silicon substrate layer 210 have opposite electric charges.

In an embodiment, the semiconductor apparatus 200 comprises a silicon substrate layer 210 at least portion of which is doped with dopants of a conductivity type; and a first insulator layer 220 formed above the silicon substrate layer 210, wherein the first insulator layer 220 and the dopants of the silicon substrate layer 210 have opposite electric charges.

The first insulator layer 220 may be selected based on the silicon substrate layer 210 and its dopant properties.

For example, if the silicon substrate layer 210 is selected to be of a p-type silicon substrate, then the first insulator layer 220 is selected to comprise negative static charge.

In an embodiment, the first insulator layer 220 is chosen so that the first insulator layer 220 has opposite static charge to the dopant of the silicon substrate 210. The static charge within the first insulator layer 220 will then create a depletion region at the interface between the silicon substrate 210 and the first insulator layer 220. Such depletion region prevents radio frequency (RF) signals from being transmitted at this interface.

For example, in view of radiation detectors, negative static charge layer ALD aluminium nitride in contact with high resistivity p-type silicon will produce reduced leakage currents. The same effect is achieved for the integrated passive devices (IPDs).

In an embodiment, the silicon substrate 210 comprises p-type silicon and the first insulation layer 220 comprises materials, such as ALD, PECVD oxide and PECVD nitride, to generate opposite static charge in view of the silicon substrate 210.

In an embodiment, thickness of the first insulator layer 220 may be determined based on the static charge of the layer 220 and the substrate layer 210 properties, for example. Thus, by optimizing the thickness of the first insulator layer 220 in view of the substrate 210, the operation, especially RF properties, of the apparatus 200 is improved.

In an embodiment, the method used for growing the first insulator layer 220 may affect the static charge of the layer 220 and thus also to the performance of the apparatus 200.

For example, by growing PECVD oxide of the first insulation layer 220 using a PECVD silane process/oxidation, the static charge of the first insulator layer 220 is higher than if using thermic oxide, for example.

In an embodiment, the first insulator layer 220 may be understood as a passivation layer.

In an embodiment, the first insulation layer 220 (the passivation layer) composition and thickness may be determined and to depend on the substrate layer 210, such as the silicon substrate. The first insulation layer 220 (the passivation layer) may comprise a plurality of layers. The plurality of layers may be at least one of an insulator layer and a diffusion barrier layer and the layers may be grown using a plurality of systems, devices or apparatuses.

In an embodiment, the semiconductor apparatus 200 comprises a first insulator layer 220 arranged between the silicon substrate layer 210 and a first metal layer 230. The first insulator layer 220 may cover at least a portion of an upper surface of the substrate layer 210, such as the portion of the silicon substrate layer 210 facing the lower surface of the first metal layer 230.

A second insulator layer 240 may be arranged between the first metal layer 230 element and a second metal layer 231 element, wherein the second metal layer 231 is arranged above the first metal layer 230.

In an embodiment, the semiconductor apparatus 200 comprises a second insulator layer 240 arranged between the first metal layer 230 and a second metal layer 231. The second insulator layer 240 may cover at least a portion of the first metal layer 230, such as the portion of the upper surface of the first metal layer 230 facing the lower surface of the second metal layer 231.

At least a portion of the second insulator layer 240 may be interrupted between the first metal layer 230 element and a third metal layer 250, 251 element to provide connection between the elements 230, 251, wherein the third metal layer 250, 251 is arranged above the second metal layer 231.

In an embodiment, the semiconductor apparatus 200 comprises a third insulator layer 211 arranged above the second insulator layer 240. The third insulator layer 211 may extend between the second metal layer 231 and a third metal layer 250, 251. The third insulator layer 211 may cover at least a portion of the second insulator layer 240 and at least a portion of the second metal layer 231. At least a portion of the third insulator layer 211 may be interrupted between the first metal layer 230 element and a third metal layer 250, 251 element to provide connection between the elements 230, 251.

In an embodiment, a second metal layer 231 element may be arranged within the third insulator layer 211 so that a lower surface of the second metal layer 231 element levels with a lower surface of the third insulator layer 211 and also with an upper surface of the second insulator layer 240, as shown in FIG. 2.

In an embodiment, the third insulator layer 211 may cover at least a portion of the second metal layer 231. At least a portion of the third insulator layer 211 may be interrupted between the second metal layer 231 element and a third metal layer 250, 251 element to provide connection between the elements 231, 250.

In an embodiment, at least one barrier layer may be formed to a metal layer 230, 231, 250, 251 element extending on a surface of the at least one metal layer.

The barrier layer may comprise a low-pressure chemical vapor deposition nitride (LPCVD SiN) or a plasma enhanced chemical vapor deposition nitride (PECVD SiN).

At least one insulator layer 220 may comprise an Atomic Layer Deposition (ALD) grown aluminum oxide layer. By arranging Atomic Layer Deposition (ALD) grown aluminum oxide layer to be the first layer 220 to contact with the substrate 210, improved performance is achieved. The insulator layer 220 may also comprise a PECVD layer on top of the ALD layer.

At least one insulator layer 220, 240 of the semiconductor apparatus 200 may comprise a plasma enhanced chemical vapor deposition (PECVD) layer, such as tetraethylorthosilicate (TEOS).

At least one insulator layer 211 of the semiconductor apparatus 200 may comprise a spin coated polyimide layer.

In an embodiment, at least one of the first and the second insulator layers 220, 240 comprises a negative static charge Atomic Layer Deposition (ALD) grown aluminum oxide layer arranged above the silicon substrate layer 210, and a third insulator layer 211 comprises a spin coated polyimide layer arranged above the Atomic Layer Deposition (ALD) grown aluminum oxide layer.

A static charge of the at least one insulator layer 220, 240 generates a depletion or accumulation region at an interface between the at least one insulator layer 211, 220, 240 and the silicon substrate layer 210.

In an embodiment, conductive pads may be connected to at least one metal layer 230, 231, 250, 251 element for electrically coupling to the integrated passive device (IPD) of the semiconductor apparatus 200. The metal layer pads of the semiconductor apparatus 200 may be coupled to integrated passive device (IPD) terminals, for example.

The insulator layers 211, 220, 240 affect to the RF performance of the apparatus 200. The first insulator layer 220 in contact with the high resistivity silicon substrate 210 should be chosen so that the first insulator layer 220 has opposite static charge to the dopant of the silicon substrate 210. The static charge within the first insulator layer 220 will then create a depletion region at the interface between the silicon 110 and the first insulator 250. Such depletion region prevents radio frequency (RF) signals from being transmitted at this interface.

There are different ways to improve RF performance of the semiconductor apparatus 200. First, a depletion region may be generated by arranging an insulator layer 220 having opposite static charge compared to the substrate layer 210. Second, thickness of the insulator layer 220 may be optimized in view of the materials and forming methods of the substrate 210 and the insulator layer 220, for example. Third, an insulator layer 220 may be selected that has minimum static charge, depending on the implementation. Combination of different methods may be applied as well.

For example, in view of radiation detectors, negative static charge layer ALD aluminium oxide in contact with high resistivity p-type silicon will produce reduced leakage currents. The same effect is achieved for the integrated passive devices (IPDs).

In an embodiment, different insulator deposition methods may be used to result different RF performances. RF performance may be optimized, for example, with a thin oxide layer 220 with minimal static charge.

It is further noticed that all processes that may consume the first insulator layer 220 on the IPD components may make RF performance worse. For example, thermal oxidation (high temperature) of the substrate 210 does not make the substrate 210 to perform worse but if the oxide is then etched away and the substrate 210 is re-oxidized, the performance may be weakened. That can be avoided by different embodiments disclosed throughout this description and FIGS. 2 to 5.

In an embodiment, the first insulator layer 220 in contact with the high resistivity silicon 210 should be chosen to have opposite static charge to the high resistivity silicon.

In an embodiment, the second insulator layer 240 may have minimal static charge and the thickness may be kept small.

In an embodiment, the semiconductor apparatus 200 includes a substrate 210, an integrated passive device (IPD) metal layer elements 230, 231, 250, 251, a first insulator layer 220, a second insulator layer 240, and a third insulator layer 211. Dielectric material may be used for at least one of the insulator layers.

In an embodiment, integrated passive device (IPD) processing may be done using special high resistive silicon substrates 210. Such high resistivity silicon substrates 210 with novel isolator (passivation) layer(s) do not necessarily behave the same way as standard silicon wafers.

The thickness and material type of an insulator layer 220 in contact with the integrated passive device (IPD) substrate 210 has an effect to the performance of the apparatus 200. Especially RF performance is affected.

The substrate 210 may comprise a glass or a silicon substrate in some implementations. The integrated passive device (IPD) and the isolating dielectric layer are illustrated on a first surface (e.g., top surface) of the substrate 210. In some implementations, the integrated passive device (IPD) and the isolating dielectric layer are arranged on a second surface (e.g., bottom surface) of the substrate 210, or on both surfaces.

In an embodiment, the integrated passive device (IPD) may be at least one of a capacitor, inductor and resistor. It should be noted that FIG. 2 illustrates conceptual representations of the integrated passive device (IPD).

Integrated passive device (IPD) process may comprise basic building blocks like high quality factor (Q) inductors, capacitors and transmission lines. High-Q components and circuits that are suitable to be realized with integrated passive device (IPD) may comprise, for example, capacitors, inductors, baluns, filters, matching networks, antennas, antenna arrays, and feed networks.

The semiconductor apparatus 200 may comprise thin film resistors, or metal-insulator-metal (MIM) capacitors between metal layer elements 230, 231, 250, 251, for example. Furthermore, a copper metal layer may be provided for high quality factor transmission lines and passive components, for example. Metal layers may be separated by a polyimide layer 211 and different metal layer elements of the same metal layer may be separated by a second polyimide material. As a further step, flip chip bumps may be deposited to allow component assembly to modules.

A $SiO_2$ may be used as a dielectric material for the IPD process but other materials are also available if higher capacitance densities are needed. For example, $Ta_2O_5$, $HfO$ or $ZrO_2$ have permittivity of 25, 16 and 20. The resistance of the thin film resistor layer can be chosen according to application. For example, resistance of the standard process thin film resistors is good for matched RF terminations and resistor for resistive Wilkinson power dividers. Applications such as RF MEMS biasing circuits need resistance values preferably above 500 ohm.

In an embodiment, negative static charge ALD alumina (aluminium oxide layer) could be used as the first insulator layer 220 in contact with high resistivity silicon and PECVD TEOS could be used on top of the ALD.

Figure 3:
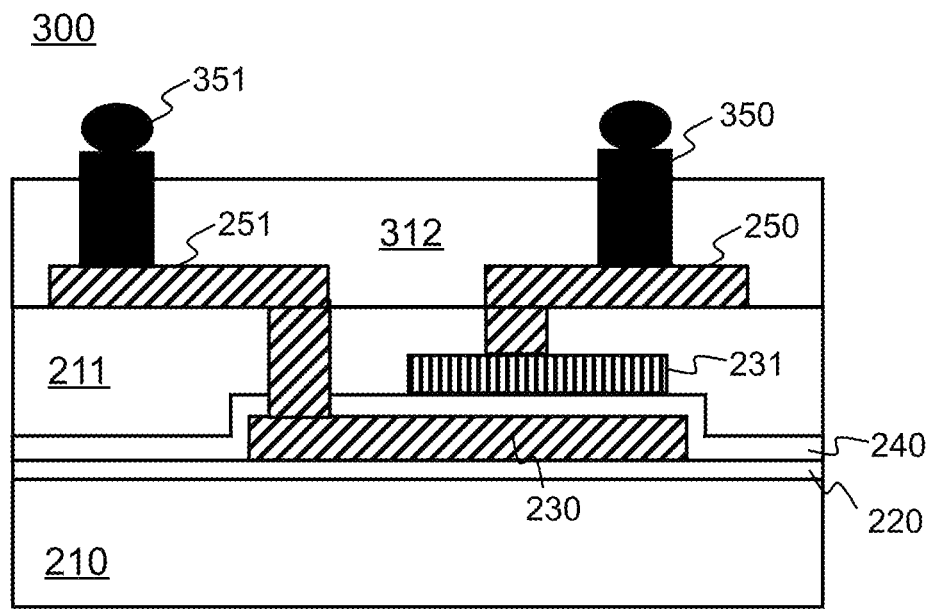
FIG. 3 illustrates a semiconductor apparatus according to another embodiment of the present disclosure.

FIG. 3 illustrates a semiconductor apparatus 300 according to another embodiment of the present disclosure. The semiconductor apparatus 300 may comprise a multi metal layer integrated passive device (IPD) apparatus, for example.

The semiconductor apparatus 300 may comprise a multi-purpose technology being suitable for a plurality of RF applications and frequencies from Very High Frequency (VHF) to millimetre waves. The semiconductor apparatus 200 may further comprise thin film resistors, metal inductors, and metal-insulator-metal (MIM) capacitors between different metal layers.

A semiconductor apparatus 300 comprises a silicon substrate layer 210 at least portion of which is doped with dopants of a conductivity type, and at least one insulator layer 211, 220, 240, 312 formed above the silicon substrate layer 210, wherein the at least one insulator layer 220 and the dopants of the silicon substrate layer 210 have opposite electric charges.

In an embodiment, the semiconductor apparatus 300 comprises a silicon substrate layer 210 at least portion of which is doped with dopants of a conductivity type; and a first insulator layer 220 formed above the silicon substrate layer 210, wherein the first insulator layer 220 and the dopants of the silicon substrate layer 210 have opposite electric charges.

The first insulator layer 220 may be selected based on the silicon substrate layer 210 and its dopant properties.

For example, if the silicon substrate layer 210 is selected to be of a p-type silicon substrate, then the first insulator layer 220 is selected to comprise negative static charge.

In an embodiment, the first insulator layer 220 is chosen so that the first insulator layer 220 has opposite static charge to the dopant of the silicon substrate 210. The static charge within the first insulator layer 220 will then create a depletion region at the interface between the silicon substrate 210 and the first insulator 220. Such depletion region prevents radio frequency (RF) signals from being transmitted at this interface.

For example, in view of radiation detectors, negative static charge layer ALD aluminium oxide/nitride in contact with high resistivity p-type silicon will produce reduced leakage currents. The same effect is achieved for the integrated passive devices (IPDs).

Alternatively, positive static charge layer ALD aluminium oxide/nitride in contact with high resistivity n-type silicon may be used, for example.

In an embodiment, the silicon substrate 210 comprises p-type silicon and the first insulation layer 220 (alone or in combination with a second insulator layer 240, for example) comprises materials, such as ALD aluminium oxide (Al2O3), PECVD oxide and PECVD nitride, to generate opposite static charge in view of the silicon substrate 210.

In an embodiment, thickness of the first insulator layer 220 may be determined based on the static charge of the first insulator layer 220 and the substrate layer 210 properties, for example. Thus, by optimizing the thickness of the first insulator layer 220 in view of the substrate 210, the operation, especially RF properties, of the apparatus 300 may be improved.

In an embodiment, the method used for growing the first insulator layer 220 may affect the static charge of the layer 220 and thus also to the performance of the apparatus 300.

For example, by growing PECVD oxide of the first insulation layer 220 using a PECVD silane process/oxidation, the static charge of the first insulator layer 220 is higher than if using thermic oxide, for example.

In an embodiment, the first insulator layer 220 may be understood as a passivation layer.

In an embodiment, the first insulation layer 220 (the passivation layer) composition and thickness may be determined and to depend on the substrate layer 210, such as the silicon substrate. The first insulation layer 220 (the passivation layer) may comprise a plurality of layers. The plurality of layers may be at least one of an insulator layer and a diffusion barrier layer and the layers may be grown using a plurality of systems, devices or apparatuses.

In an embodiment, the semiconductor apparatus 300 comprises a first insulator layer 220 arranged between the silicon substrate layer 210 and a first metal layer 230. The first insulator layer 220 may cover at least a portion of an upper surface of the substrate layer 210, such as the portion of the substrate layer 210 facing the lower surface of the first metal layer 230.

In an embodiment, the semiconductor apparatus 300 comprises a second insulator layer 240 arranged between the first metal layer 230 and a second metal layer 231. The second insulator layer 240 may cover at least a portion of the first metal layer 230, such as the portion of the upper surface of the first metal layer 230 facing the lower surface of the second metal layer 231.

At least a portion of the second insulator layer 240 may be interrupted between the first metal layer 230 element and a third metal layer 250, 251 element to provide connection between the elements 230, 251, wherein the third metal layer 250, 251 is arranged above the second metal layer 231.

In an embodiment, the semiconductor apparatus 300 comprises a third insulator layer 211 arranged above the second insulator layer 240. The third insulator layer 211 may extend between the second metal layer 231 and a third metal layer 250, 251. The third insulator layer 211 may cover at least a portion of the second insulator layer 240 and the second metal layer 231 element. At least a portion of the third insulator layer 211 may be interrupted between the first metal layer 230 element and a third metal layer 250, 251 element to provide connection between the elements 230, 251. At least a portion of the third insulator layer 211 may be interrupted between the second metal layer 231 element and a third metal layer 250, 251 element to provide connection between the elements 231, 250.

In an embodiment, a second metal layer 231 element may be arranged within the third insulator layer 211 so that a lower surface of the second metal layer 231 element levels with a lower surface of the third insulator layer 211 and also with an upper surface of the second insulator layer 240, as shown in FIG. 3.

In an embodiment, at least one barrier layer may be formed to a metal layer 230, 231, 250, 251 element extending on a surface of the at least one metal layer.

The barrier layer may comprise a low-pressure chemical vapor deposition nitride (LPCVD SiN) or a plasma enhanced chemical vapor deposition nitride (PECVD SiN).

At least one insulator layer 220 may comprise an Atomic Layer Deposition (ALD) grown aluminum oxide layer.

At least one insulator layer 220, 240 of the semiconductor apparatus 200 may comprise a plasma enhanced chemical vapor deposition (PECVD) layer, such as tetraethylorthosilicate (TEOS).

At least one insulator layer 211 of the semiconductor apparatus 200 may comprise a spin coated polyimide layer.

In an embodiment, at least one of the first and the second insulator layers 220, 240 comprises a negative static charge Atomic Layer Deposition (ALD) grown aluminum oxide layer arranged above the silicon substrate layer 210, and a third insulator layer 211 comprises a spin coated polyimide layer arranged above the Atomic Layer Deposition (ALD) grown aluminum oxide layer.

A static charge of the at least one insulator layer 220, 240 generates a depletion region at an interface between the at least one insulator layer 211, 220, 240 and the silicon substrate layer 210.

In an embodiment, the semiconductor apparatus 300 comprises a fourth insulator layer 312 arranged above the third insulator layer 211. The fourth insulator layer 312 may cover the third metal layer 250, 251 elements and also extend horizontally between the elements 250, 251 as shown. The fourth insulator layer 312 may cover at least a portion of the third insulator layer 211. At least a portion of the fourth insulator layer 312 may be interrupted to provide a connection to the at least one metal layer 250, 251 element through the fourth insulator layer. Interruption to the fourth insulator layer 312 may be arranged for the connection pad 350 between the third metal layer 250, 251 element and a flip bump 351, for example, to provide external connection to the semiconductor apparatus 300.

In an embodiment, the fourth insulator layer 312 of the semiconductor apparatus 300 may comprise a plasma enhanced chemical vapor deposition (PECVD) layer, such as tetraethylorthosilicate (TEOS) or some other dielectric material, for example.

In an embodiment, the conductive pads 350, 351 may be connected to at least one metal layer 230, 231, 250, 251 element for electrically coupling to the integrated passive device (IPD) of the semiconductor apparatus 300. The metal layer pads of the semiconductor apparatus 300 may be coupled to integrated passive device (IPD) terminals, for example.

At least one of the insulator layers 211, 220, 240, 312 may affect to the RF performance of the apparatus 300. The first insulator layer 220 in contact with the high resistivity silicon substrate 210 should be chosen so that the first insulator layer 220 has opposite static charge to the dopant of the silicon substrate 210. The static charge within the first insulator layer 220 will then create a depletion region at the interface between the silicon 110 and the first insulator 250. Such depletion region prevents radio frequency (RF) signals from being transmitted at this interface.

There are different ways to improve RF performance of the semiconductor apparatus 300. First, a depletion area may be generated by arranging an insulator layer 220 having opposite static charge compared to the substrate layer 210. Second, thickness of the insulator layer 220 may be optimized in view of the materials and forming methods of the substrate 210 and the insulator layer 220, for example. Third, an insulator layer 220 may be selected that has minimum static charge, depending on the implementation. Combination of different methods may be applied as well.

For example, in view of radiation detectors, negative static charge layer ALD aluminium oxide in contact with high resistivity p-type silicon will produce reduced leakage currents. The same effect is achieved for the integrated passive devices (IPDs).

In an embodiment, different insulator deposition methods may be used to result different RF performances. RF performance may be optimized, for example, with a thin oxide layer 220 with minimal static charge.

It is further noticed that all processes that may consume the first insulator layer 220 on the IPD components may make RF performance worse. For example, thermal oxidation (high temperature) of the substrate 210 does not make the substrate 210 to perform worse but if the oxide is then etched away and the substrate 210 is re-oxidized, the performance may be weakened. That can be avoided by different embodiments disclosed throughout this description and FIGS. 2 to 5.

In an embodiment, the first insulator layer 220 in contact with the high resistivity silicon 210 should be chosen to have opposite static charge to the high resistivity silicon.

In an embodiment, the second insulator layer 240 may have minimal static charge and the thickness may be kept small.

In an embodiment, the semiconductor apparatus 300 includes a substrate 210, an integrated passive device (IPD) metal layer elements 230, 231, 250, 251, a first insulator layer 220, a second insulator layer 240, a third insulator layer 211 and a fourth insulator layer 312. Furthermore, conductive pads and/or flip bumps 350, 351 are included. Dielectric material may be used for at least one of the insulator layers.

In an embodiment, integrated passive device (IPD) processing may be done using special high resistive silicon substrates 210. Such high resistivity silicon substrates 210 with novel isolator (passivation) layer(s) do not necessarily behave the same way as standard silicon wafers.

The thickness and material type of an insulator layer 220 in contact with the integrated passive device (IPD) substrate 210 has an effect to the performance of the apparatus 200. Especially RF performance is affected.

The substrate 210 may comprise a glass or a silicon substrate in some implementations. The integrated passive device (IPD) and the isolating dielectric layer are illustrated on a first surface (e.g., top surface) of the substrate 210. In some implementations, the integrated passive device (IPD) and the isolating dielectric layer are arranged on a second surface (e.g., bottom surface) of the substrate 210, or on both surfaces.

In an embodiment, the integrated passive device (IPD) may be at least one of a capacitor, inductor and resistor. It should be noted that FIG. 3 illustrates conceptual representations of the integrated passive device (IPD).

Integrated passive device (IPD) process may comprise basic building blocks like high quality factor (Q) inductors, capacitors and transmission lines. High-Q components and circuits that are suitable to be realized with integrated passive device (IPD) may comprise, for example, capacitors, inductors, baluns, filters, matching networks, antennas, antenna arrays, and feed networks.

The semiconductor apparatus 300 may comprise thin film resistors, or metal-insulator-metal (MIM) capacitors between metal layer elements 230, 231, 250, 251, 350, 351 for example. Furthermore, a copper metal layer may be provided for high quality factor transmission lines and passive components, for example. Metal layers may be separated by a polyimide layer 211, 312 and different metal layer elements of the same metal layer may be separated by a second polyimide material. As a further step, flip chip bumps may be deposited to allow component assembly to modules.

A $SiO_2$ may be used as a dielectric material for the IPD process but other materials are also available if higher capacitance densities are needed. For example, $Ta_2O_5$, HfO or $ZrO_2$ have permittivity of 25, 16 and 20. The resistance of the thin film resistor layer can be chosen according to application. For example, resistance of the standard process thin film resistors is good for matched RF terminations and resistor for resistive Wilkinson power dividers. Applications such as RF MEMS biasing circuits need resistance values preferably above 500 ohm.

In an embodiment, negative static charge ALD alumina oxide could be used as the first insulator layer 220 in contact with high resistivity silicon and PECVD TEOS could be used on top of the ALD.

In an embodiment, a semiconductor apparatus 200, 300 comprises a silicon substrate layer 210 at least portion of which is doped with dopants of a conductivity type (e.g. p-type) and a first insulator layer 220 is formed above the silicon substrate layer 210, wherein the first insulator layer 220 and the dopants of the silicon substrate layer 210 have opposite electric charges. The first insulator layer 220 may be a combination of a plurality of materials. The first insulator layer 220 may comprise an ALD alumina oxide layer (e.g. $Al_2O_3$), an insulator oxide and an insulator nitride.

The insulator oxide may comprise silane oxide, TEOS oxide, or thermal oxide, for example. For example, by growing PECVD oxide of the first insulation layer 220 using a PECVD silane process/oxidation, the static charge of the first insulator layer 220 is higher than if using thermic oxide, for example.

The insulator nitride may comprise PECVD or LPCVD nitride (SiN), for example.

In an embodiment, the first insulator layer 220 is a combination of an ALD alumina oxide layer (e.g. Al2O3), an insulator oxide comprising PECVD oxide (silane process/oxidation) and an insulator nitride comprising PECVD nitride (SiN) as barrier.

In an embodiment, at least two of the insulator layers 220, 240, 211, 312 may be provided as an integrated insulator layer comprising different materials or sub-layers 220, 240.

Figure 4:
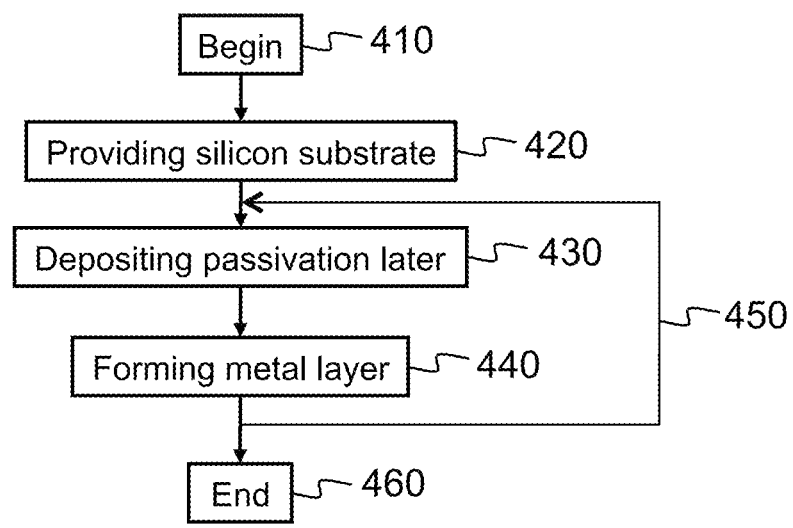
FIG. 4 shows a flow chart of a method according to an embodiment of the present disclosure.

FIG. 4 shows a flow chart of a method according to an embodiment of the present disclosure.

A method for fabricating a semiconductor apparatus comprising a passivated silicon substrate is started in step 410. In step 420, a silicon substrate is provided. This step may comprise, for example, bringing the silicon substrate into the reaction space of a typical reactor tool, e.g. a tool suitable for carrying out an ALD-type process. At least a portion of the silicon substrate layer is doped with dopants of a conductivity type. In step 430, a passivation layer is deposited on the silicon substrate layer, wherein the passivation layer and the dopants of the silicon substrate layer have opposite electric charges. The passivation layer may comprise a first insulator layer, as disclosed in different embodiments. In step 440, at least one metal layer is formed above the passivation layer. In step 450, depositing further insulator layers, such as second, third and fourth layer, for example, and forming further metal layers, such as second and third layers, for example, are performed. In step 460, method ends.

Figure 5:
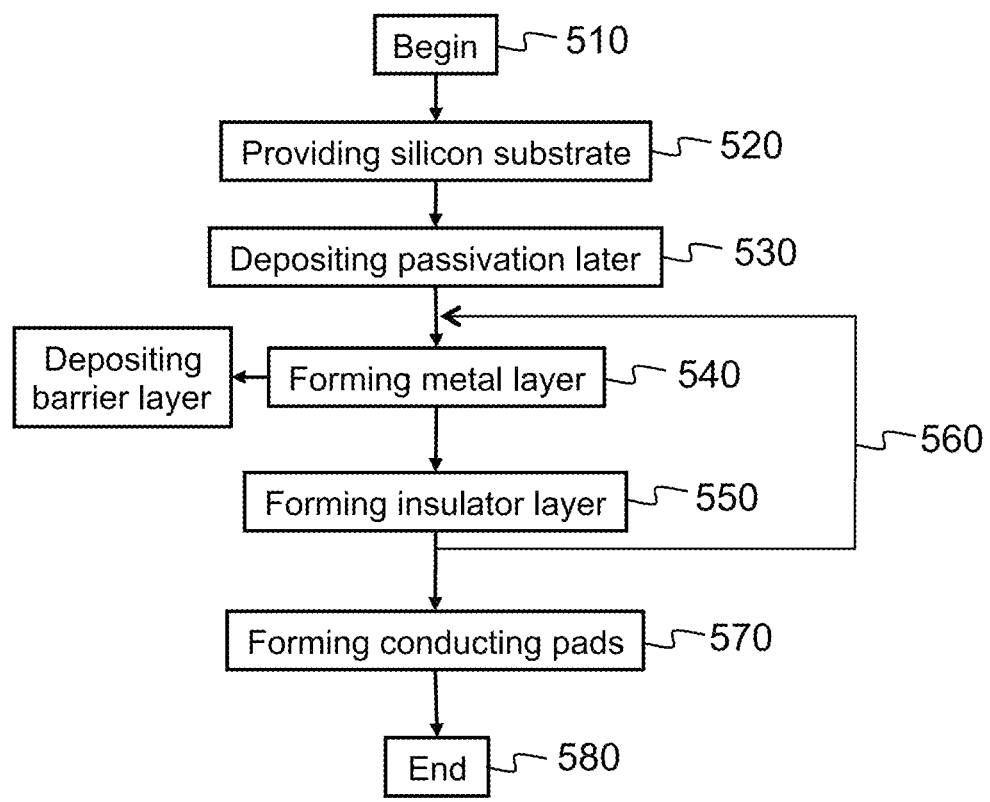
FIG. 5 shows a flow chart of another method according to an embodiment of the present disclosure.

FIG. 5 shows a flow chart of another method according to an embodiment of the present disclosure.

A method for fabricating a semiconductor apparatus comprising a passivated silicon substrate is started in step 510. In step 520, a silicon substrate is provided. This step may comprise, for example, bringing the silicon substrate into the reaction space of a typical reactor tool, e.g. a tool suitable for carrying out an ALD-type process. At least a portion of the silicon substrate layer is doped with dopants of a conductivity type. In step 530, a passivation layer is deposited on the silicon substrate layer, wherein passivation layer and the dopants of the silicon substrate layer have opposite electric charges. In step 540, a metal layer is formed above the passivation layer. Optionally, a barrier layer may be deposited in connection with the metal layer. In step 550, at least one insulator layer is formed above the metal layer. In step 560, forming further metal layers, such as second and third layers, for example, and depositing further insulator layers are performed to provide integrated passive device (IPD) elements, wherein at least a portion of at least one insulator layer is arranged between at least two metal layers. In step 570, conductive pads and/or flip bumps may be generated for the apparatus. In step 580, method ends.

In an embodiment, a passivating layer comprises aluminium oxide and is formed on a surface of a silicon substrate to protect from effects caused by chemical interaction between the passivating layer and a conducting electrode by fabricating a barrier layer between the passivating layer and the conducting electrode.

A barrier layer comprising titanium and oxygen, tantalum and oxygen, zirconium and oxygen, hafnium and oxygen, or a combination of any of these, or a combination of any of these with aluminium and oxygen, on the passivating layer may be deposited by exposing the passivating layer in a reaction space to alternately repeated surface reactions of two or more different precursors, wherein at least one of the precursors is a precursor for oxygen, and forming the conducting electrode on the barrier layer deposited on the passivating layer by making a layer comprising aluminium paste on the barrier layer.

The reaction space may be subsequently pumped down to a pressure suitable for forming the passivating layer comprising aluminium oxide. The reaction space can be pumped down to the suitable pressure using e.g. a mechanical vacuum pump or, in the case of atmospheric pressure ALD systems and/or processes, gas flows can be set to protect the deposition zone from the atmosphere. The silicon substrate may be also heated to a temperature suitable for forming the passivating layer by the used method. The silicon substrate can be introduced to the reaction space through e.g. an airtight load-lock system or simply through a loading hatch. The silicon substrate can be heated by e.g. resistive heating elements that also heat the entire reaction space.

After the silicon substrate and the reaction space have reached the targeted temperature and other conditions suitable for deposition, the silicon surface can be conditioned such that the passivating deposit may be essentially directly deposited on the silicon surface. This conditioning of the silicon surface on which the passivating layer is to be deposited can include chemical purification of the surface of the silicon film from impurities and/or oxidation. Especially removal of oxide is beneficial when the silicon surface has been imported into the reaction space via an oxidizing environment, e.g. when transporting the exposed silicon surface from one deposition tool to another. The details of the process for removing impurities and/or oxide from the surface of the silicon film will be obvious to the skilled person in view of this specification. In some embodiments of the present disclosure the conditioning can be done ex-situ, i.e. outside the tool suitable for ALD-type processes.

After the silicon substrate has been conditioned, an alternate exposure of the deposition surface to different precursor chemicals may be started, to form the passivating layer (comprising e.g. aluminium oxide) directly on the silicon substrate. Each exposure of the deposition surface to a precursor results in the formation of additional deposit on the deposition surface, as a result of adsorption reactions of the corresponding precursor with the deposition surface.

A typical reactor suitable for ALD-type deposition comprises a system for introducing carrier gas, such as nitrogen or argon into the reaction space such that the reaction space can be purged from surplus chemical and reaction by-products before introducing the next precursor chemical into the reaction space. This feature together with the controlled dosing of vaporized precursors enables alternately exposing the substrate surface to precursors without significant intermixing of different precursors in the reaction space or in other parts of the reactor. In practice the flow of carrier gas is commonly continuous through the reaction space throughout the deposition process and only the various precursors are alternately introduced to the reaction space with the carrier gas.

Thickness of the passivating layer on the silicon substrate can be controlled by the number of exposures of the deposition surface to the different precursors. The thickness of the passivating layer is increased until a targeted thickness is reached, after which the at least one insulator layer is deposited.

Deposition of the insulator layer, in one embodiment of the present disclosure, is carried out in an ALD-type process in the same deposition tool directly after the deposition of the passivating layer has ended. In this case deposition of the insulator layer can begin simply by changing the precursor chemicals from those used for the deposition of the passivating layer to those suitable for the deposition of the insulator layer.

In an embodiment, a bond wire package includes an integrated passive device (IPD) stacked on a die. The die may be disposed on a leadframe. The leadframe may be a pin grid array (PGA) package, a quad flat non-leaded (QFN) package or other package. The leadframe may comprise first pads and may be mounted on a PCB. An intermediate layer may be disposed between the integrated passive device (IPD) and the die and connect the integrated passive device (IPD) to the die. The integrated passive device (IPD), the die, and the intermediate layer may replace the integrated passive device (IPD) and die.

In an embodiment, the semiconductor apparatus includes a first substrate. The substrate may be a P-tap or N-tap substrate, which is doped. A second substrate may not be doped and is configured for passive devices. The second substrate may have one or more metallization layers formed thereon. The second substrate may have any number of metallization layers and/or insulation layers disposed on the second substrate, and/or under the second substrate. The metallization layers may include passive devices, portions of passive devices, and/or interconnect devices (e.g., couplers, jumpers, traces, etc.). The second substrate may have higher resistivity than the first substrate and the PCB, for example.

The integrated passive device (IPD) includes an insulation layer or the second substrate, and the metallization layers. The insulation layer or the second substrate is disposed between the metallization layers. The insulation layer or the second substrate may include vias. The vias may be through glass vias (TGVs) or through silicon vias (TSVs). The vias may connect the first metallization layer and/or passive devices on the first metallization layer to the second metallization layer and/or passive devices on the second metallization layer. Each of the passive devices may be implemented on one or more layers of the integrated passive device (IPD).

As an example, an inductance is implemented in the IPD. The inductance may include traces (or conductive elements) in the metallization layers and some of the vias. Any of the inductances may be implemented in layers of an IPD. Due to the configuration of the inductance having conductive elements on multiple layers, a magnetic field generated by the inductance may be directed in a direction laterally across the IPD. This prevents the magnetic field generated by the inductance from affecting the active devices and/or corresponding signals in a die, which reduces interference experienced by the active devices. If an inductance were to be implemented as a planar structure in the IPD, then the inductance may generate a magnetic field that is directed perpendicular to and towards the die, which would result in interference.

Additional pads may be disposed on the IPD. The pads may be connected to the first pads by bond wires. The pads may be connected to the metallization layer and/or passive devices in the metallization layer.

Without in any way limiting the scope, interpretation, or application of the claims appearing below, a technical effect of one or more of the example embodiments disclosed herein is an increased radio frequency (RF) performance of a surface passivated silicon substrate. Another technical effect of one or more of the example embodiments disclosed herein is an improved fabrication process of an integrated passive device (IPD). Another technical effect of one or more of the example embodiments disclosed herein is the provision of a reliable and compact semiconductor apparatus.

Although various aspects of the disclosed embodiments are set out in the independent claims, other aspects of the present disclosure comprise other combinations of features from the described embodiments and/or the dependent claims with the features of the independent claims, and not solely the combinations explicitly set out in the claims.

It is also noted herein that while the foregoing describes example embodiments of the present disclosure, these descriptions should not be viewed in a limiting sense. Rather, there are several variations and modifications that may be made without departing from the scope of the present disclosure as defined in the appended claims.

The invention claimed is:

1. A semiconductor apparatus comprising:
a surface passivated silicon substrate layer at least a portion of which is doped with dopants of a conductivity type;
a first insulator layer formed above the silicon substrate layer; wherein the first insulator layer and the dopants of the silicon substrate layer have opposite electric charges, wherein a static charge of the first insulator layer causes forming of a depletion region at an interface between the at least one insulator layer and the silicon substrate layer, and wherein the first insulator layer has thickness that is determined based on the static charge of the first insulator layer and properties of the silicon substrate layer;
a first metal layer, wherein the first insulator layer is arranged between the silicon substrate layer and the first metal layer; and
a second insulator layer and a second metal layer, wherein the second insulator layer is arranged between the first metal layer and the second metal layer, and the second metal layer is arranged above the first metal layer,
wherein at least one of the first insulator layer and the second insulator layer comprises an Atomic Layer Deposition (ALD) grown aluminum oxide layer, an Atomic Layer Deposition (ALD) grown aluminum nitride layer, or a plasma enhanced chemical vapor deposition (PECVD) oxide or nitride layer.

2. The semiconductor apparatus of claim 1, comprising an integrated passive device.

3. The semiconductor apparatus of claim 1, further comprising:
a third insulator layer and a third metal layer, wherein at least a portion of the third insulator layer is arranged between the second metal layer and the third metal layer, and the third metal layer is arranged above the second metal layer.

4. The semiconductor apparatus of claim 3, further comprising:
a fourth insulator layer arranged above the third insulator layer, configured to cover at least partially elements of the third metal layer and to extend horizontally between the elements of the third metal layer.

5. The semiconductor apparatus of claim 4, further comprising:
at least one conductive pad connected to the at least one metal layer element through the fourth insulator layer, configured to provide external connection to the semiconductor apparatus.

6. The semiconductor apparatus of claim 1, further comprising:
at least one barrier layer extending on a surface of at least one metal layer.

7. The semiconductor apparatus of claim 1, wherein the first insulator layer comprises a negative static charge Atomic Layer Deposition, ALD, grown aluminum oxide layer arranged above the silicon substrate layer, wherein the dopants of the silicon substrate layer are of p-type.

8. The semiconductor apparatus of claim 1,
wherein the first insulator layer covers an upper surface of the substrate layer facing a lower surface of the first metal layer.

9. A method for manufacturing a semiconductor apparatus, comprising:
providing a surface passivated silicon substrate comprising dopants of a first conductivity type;
depositing a first insulator layer on the silicon substrate, wherein a static charge of the first insulator layer is of a second conductivity type, opposite to the first conductivity type, wherein the static charge of the first insulator layer causes forming of a depletion region at an interface between the at least one insulator layer and the silicon substrate layer, and wherein the first insulator layer has thickness that is determined based on the static charge of the first insulator layer and properties of the silicon substrate layer;
forming a first metal layer above the first insulator layer; and
forming a second insulator layer and a second metal layer, wherein the second insulator layer is arranged between the first metal layer and the second metal layer, and the second metal layer is arranged above the first metal layer,
wherein at least one of the first insulator layer and the second insulator layer comprises an Atomic Layer Deposition (ALD) grown aluminum oxide layer, an Atomic Layer Deposition (ALD) grown aluminum nitride layer, or a plasma enhanced chemical vapor deposition (PECVD) oxide or nitride layer.

10. The method of claim 9, further comprising:
depositing a barrier layer in connection with at least one of the first and second metal layers.

11. The method of claim 9, further comprising:
depositing further insulator layers to provide integrated passive device, IPD, elements, wherein at least a portion of at least one of the further insulator layers is arranged between the at least two metal layers.

12. A semiconductor apparatus comprising:
a surface passivated silicon substrate layer at least a portion of which is doped with dopants of a conductivity type;
a first insulator layer formed above the surface passivated silicon substrate layer; wherein the first insulator layer and the dopants of the surface passivated silicon substrate layer have opposite electric charges, wherein a static charge of the first insulator layer causes forming of a depletion region at an interface between the at least one insulator layer and the surface passivated silicon substrate layer, and wherein the first insulator layer has thickness that is determined based on the static charge of the first insulator layer and properties of the surface passivated silicon substrate layer;
a first metal layer, wherein the first insulator layer is arranged between the surface passivated silicon substrate layer and the first metal layer; and
a second insulator layer and a second metal layer, wherein the second insulator layer is arranged between the first metal layer and the second metal layer, and the second metal layer is arranged above the first metal layer,
wherein the first insulator layer comprises an Atomic Layer Deposition (ALD) aluminum oxide layer in contact with the surface passivated silicon substrate, and a plasma enhanced chemical vapor deposition (PECVD) layer on top of the ALD aluminum oxide layer.

13. The semiconductor apparatus of claim 12,
wherein the first insulator layer comprises a negative static charge ALD aluminum oxide layer in contact with the surface passivated silicon substrate, and a PECVD TEOS layer on top of the ALD aluminum oxide layer.

* * * * *